United States Patent
Oh et al.

(10) Patent No.: US 7,920,021 B2
(45) Date of Patent: Apr. 5, 2011

(54) METHOD OF APPLYING WIRE VOLTAGE TO SEMICONDUCTOR DEVICE

(75) Inventors: Jin-Yong Oh, Hwaseong-si (KR); Sang-youn Jo, Suwon-si (KR); Joon-hee Lee, Seongnam-si (KR); Jae-sun Yun, Anyang-si (KR); Seong-soo Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 29 days.

(21) Appl. No.: 12/580,299

(22) Filed: Oct. 16, 2009

(65) Prior Publication Data

US 2010/0207690 A1    Aug. 19, 2010

(30) Foreign Application Priority Data

Feb. 13, 2009    (KR) .................. 10-2009-0012116

(51) Int. Cl.
*H01L 25/00* (2006.01)
(52) U.S. Cl. ...................................... 327/565
(58) Field of Classification Search ........... 327/564, 327/565, 566
See application file for complete search history.

(56) References Cited

U.S. PATENT DOCUMENTS

| 6,011,287 A * | 1/2000 | Itoh et al. ................. 257/315 |
| 7,079,437 B2 * | 7/2006 | Hazama et al. .......... 365/210.12 |
| 7,480,178 B2 * | 1/2009 | Park et al. ............... 365/185.17 |

FOREIGN PATENT DOCUMENTS

| KR | 1020060070025 A | 6/2006 |
| KR | 1020060070028 A | 6/2006 |
| KR | 1020060110755 A | 10/2006 |

* cited by examiner

*Primary Examiner* — Jeffrey S Zweizig
(74) *Attorney, Agent, or Firm* — Volentine & Whitt, PLLC

(57) ABSTRACT

A method of applying a wire voltage to a semiconductor device including a plurality of active regions and a field region insulating the plurality of active regions, wherein the field region includes a plurality of wires. The method includes applying an operating voltage required for an operation of the semiconductor device to at least one of the plurality of wires, and applying a voltage lower than the operating voltage to a wire adjacent to at least one of the plurality of active regions from among the plurality of wires. Thus, leakage current caused by an imaginary parasitic transistor due to a wire of the field region may be prevented.

7 Claims, 6 Drawing Sheets

METHOD OF APPLYING WIRE VOLTAGE TO SEMICONDUCTOR DEVICE

CROSS-REFERENCE TO RELATED APPLICATIONS

A claim of priority under 35 U.S.C. 119 is made to Korean Patent Application No. 10-2009-0012116, filed on Feb. 13, 2009, the entirety of which is incorporated herein by reference.

BACKGROUND

The inventive concepts described herein are generally related to a method of applying a wire voltage to a semiconductor device, and more particularly to a method of applying a wire voltage to a semiconductor device in a way that reduces leakage current of the semiconductor device.

Semiconductor memory devices, which store data, are largely categorized into volatile memory devices and non-volatile memory devices. Volatile memory devices lose stored data upon removal of the power supply, while non-volatile memory devices retain stored data upon removal of the power supply. Non-volatile memory devices may be categorized as electrically erasable programmable read-only memories (EE-PROMs), flash memories, and so on, and flash memories may be categorized as NOR flash memories and NAND flash memories.

Some of such semiconductor memory devices may perform a programming operation by applying a high voltage to a memory cell. With the recent increase in integration density of semiconductor devices, leakage current may flow between regions of the semiconductor devices. A parasitic transistor may be formed by wires such as a conductive gate to which a high voltage required for a memory cell programming operation is applied, and by active regions surrounding the conductive gate to which the high voltage is applied, and thus leakage current may occur.

SUMMARY

According to an embodiment of the inventive concept, there is provided a method of applying a wire voltage to a semiconductor device including a plurality of active regions and a field region insulating the plurality of active regions, the field region may include a plurality of wires, the method including applying an operating voltage required for an operation of the semiconductor device to at least one of the plurality of wires; and applying a voltage lower than the operating voltage to a wire from among the plurality of wires that is adjacent to at least one of the plurality of active regions.

The plurality of wires may be respectively connected to a plurality of word lines, and the operating voltage may include a programming voltage. The semiconductor device may include a plurality of selection transistors respectively formed on the plurality of active regions.

The active regions may include first and second active regions which are respectively disposed on opposite sides of an entire set of the plurality of wires, a parasitic field effect transistor (FET) may be formed by the first and second active regions and the plurality of wires, and the method further including applying a lowest voltage from among voltages applied to the plurality of wires to a wire from among the plurality of wires that is the most adjacent to at least one of the first and second active regions. The method may further include applying a second lowest voltage from among the voltages applied to the plurality of wires to a second wire from among the plurality of wires that is adjacent to the wire that is most adjacent to at least one of the first and second active regions.

The active regions may include first and third active regions which are both disposed adjacent to an outermost wire from among the plurality of wires, a parasitic FET may be formed by the first and third active regions and the plurality of wires, and the method may further include applying a lowest voltage from among voltages applied to the plurality of wires to a wire from among the plurality of wires that is most adjacent to the first and third active regions. The method may further include applying a second lowest voltage from among the voltages applied to the plurality of wires to a second wire that is adjacent to the outermost wire.

The semiconductor device may further include at least one of a ground select line (GSL), a source select line (SSL) and a dummy wire disposed adjacent to one of the active regions on the field region.

The lowest voltage from among the voltages applied to the plurality of wires may be equal to or less than 20 V. A voltage applied to the ground select line (GSL), the source select line (SSL) and the dummy wire may be equal to or less than 20 V.

BRIEF DESCRIPTION OF THE DRAWINGS

The embodiments of the inventive concept will be more clearly understood from the following detailed description taken in conjunction with the accompanying drawings in which.

DETAILED DESCRIPTION OF THE EMBODIMENTS

Figure 1:
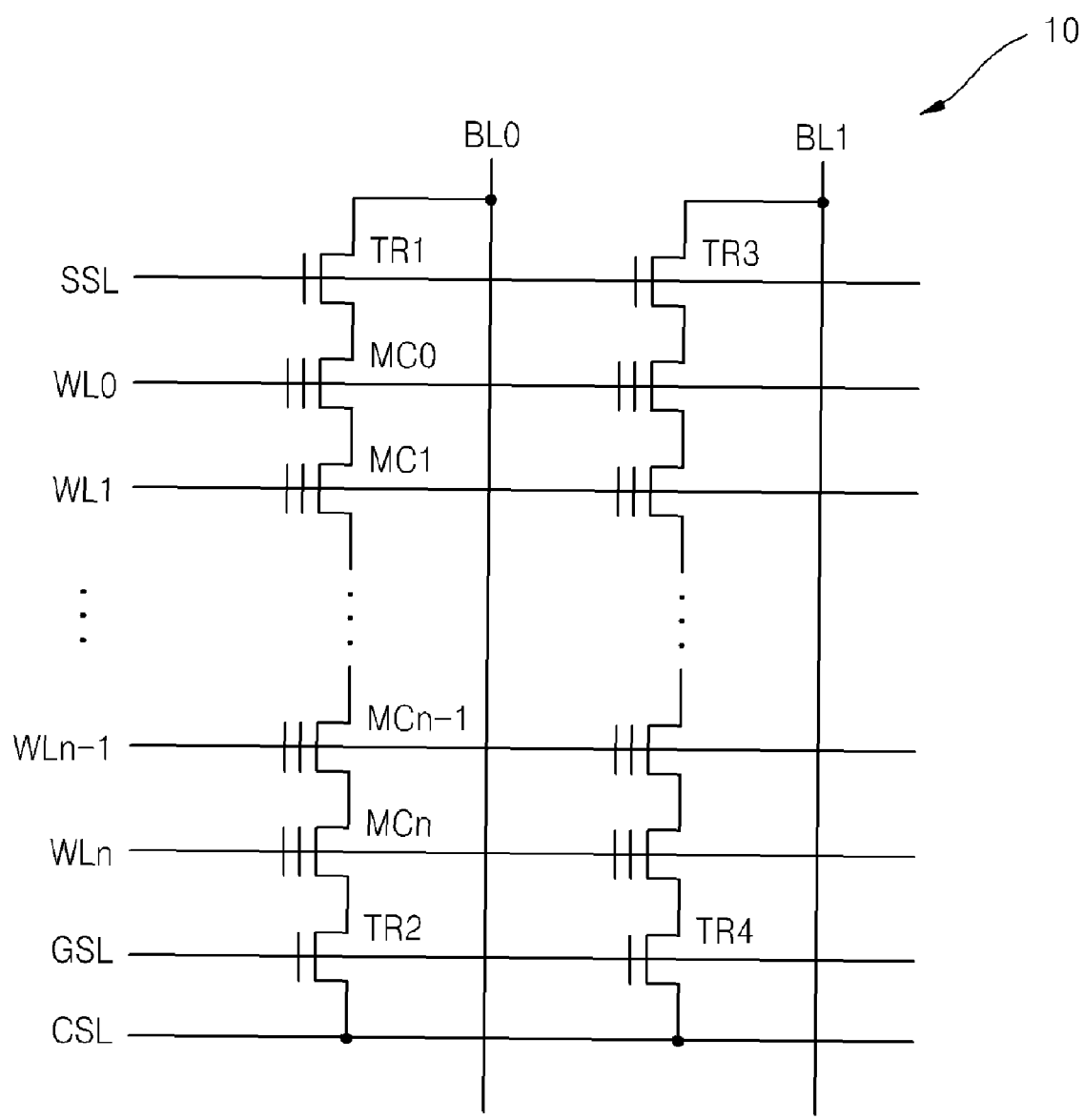
FIG. 1 is a circuit diagram of a semiconductor device according to an embodiment of the inventive concept.

Reference will now be made in detail to example embodiments, which are illustrated in the accompanying drawings. The inventive concept however should not be limited to the embodiments described hereinafter, and the embodiments herein are rather introduced to provide easy and complete understanding of the scope and spirit of the inventive concept. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

FIG. 1 is a circuit diagram of a semiconductor device 10 according to an embodiment. Referring to FIG. 1, the semiconductor device 10 according to the present embodiment is a NAND flash memory device. Hereinafter, the semiconductor device 10 will be described as an example of a NAND flash memory device, but is not limited thereto. Thus, another semiconductor device including a memory cell to which a high voltage is applied may be used. For example, a semiconductor device including a memory cell to which a high voltage is applied during a programming operation may be used.

The semiconductor device 10 includes first through Nth word lines WL0, WL1, through WLn-1 and WLn (n is a natural number), a plurality of bit lines BL0 and BL1 crossing the first through Nth word lines WL0, WL1, through WLn-1 and WLn, and first through Nth memory cells MC0, MC1, through MCn-1 and MCn disposed at points of intersection between the first through Nth word lines WL0, WL1, through WLn-1 and WLn and the bit lines BL0 and BL1. The first through Nth memory cells MC0, MC1, through MCn-1 and MCn are connected in series to each other.

The semiconductor device 10 may further include a source select line SSL, a ground select line GSL, and a common source line CSL. First and third selection transistors TR1 and TR3 are disposed at points of intersection between the source select line SSL and the bit lines BL0 and BL1, respectively. Second and fourth selection transistors TR2 and TR4 are disposed at points of intersection between the ground select line GSL and the bit lines BL0 and BL1, respectively.

Although not illustrated in FIG. 1, a dummy line may be further disposed between the first word line WL0 and the source select line SSL, and also between the Nth word line WLn and the ground select line GSL.

Figure 2:
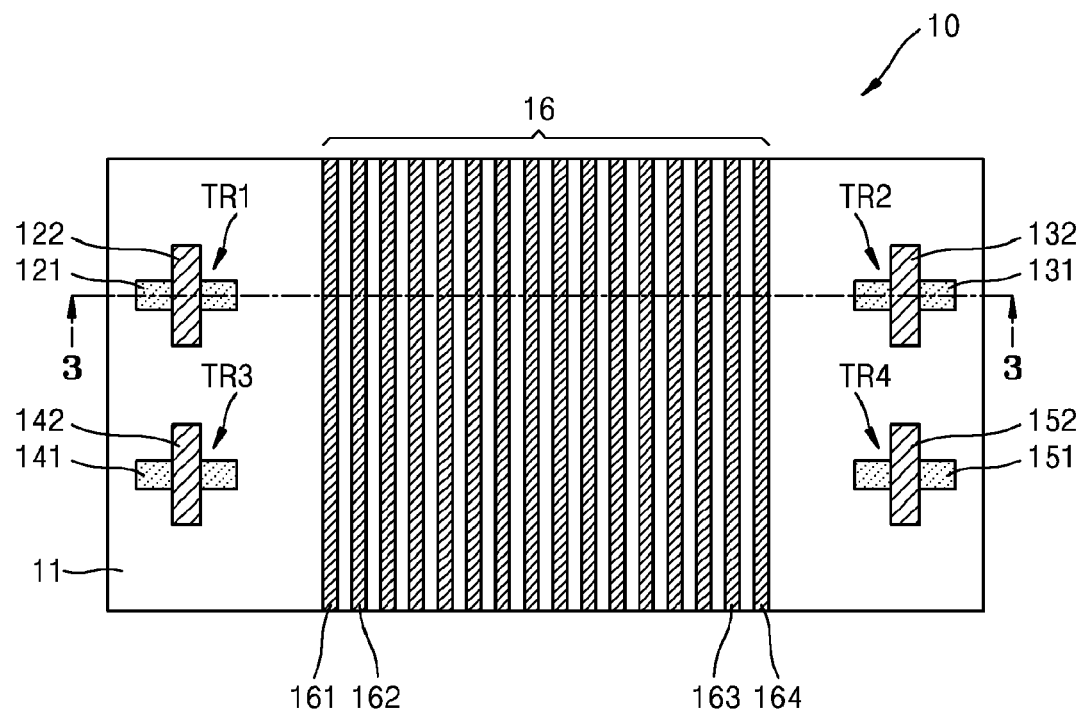
FIG. 2 is a plan view of the semiconductor device of FIG. 1.

FIG. 2 is a plan view of the semiconductor device 10 of FIG. 1, according to an embodiment of the inventive concept.

Referring to FIG. 2, the semiconductor device 10 includes a plurality of active regions formed on a substrate 11, and a field region insulating the active regions from each other. In FIG. 2, white areas and dotted areas on the substrate 11 indicate the field region and the active regions, respectively. The substrate 11 may be a semiconductor substrate, and may include, for example, silicon, silicon-on-insulator, silicon-on-sapphire, germanium, silicon-germanium, or gallium-arsenide. According to the present embodiment, the substrate 11 may be a P-type semiconductor substrate. The active regions and the field region may be defined by performing a mask process on the substrate 11 so as to form a field oxide layer.

First through Nth wires 16 are formed on the field region. The first through Nth wires 16, which correspond to the first through Nth memory cells MC0, MC1, through MCn-1 and MCn, respectively, may be formed on the field region. The first through Nth wires 16 in FIG. 2 may be respectively connected to the first through Nth word lines WL0, WL1, through WLn-1 and WLn of FIG. 1.

The first through fourth selection transistors TR1, TR2, TR3 and TR4 are respectively formed on the active regions. The first selection transistor TR1 includes a first gate electrode 122 formed on a first active region 121, and source/drain impurity regions (not shown) formed on both sides of the first gate electrode 122 on the first active region 121. The second selection transistor TR2 includes a second gate electrode 132 formed on a second active region 131, and source/drain impurity regions (not shown) formed on both sides of the second gate electrode 132 on the second active region 131. The first and second selection transistors TR1 and TR2 are respectively arranged at both sides of the wires 16. In this regard, the first selection transistor TR1 is disposed adjacent to the first wire 161, and the second selection transistor TR2 is disposed adjacent to the Nth wire 164. In addition, the third and fourth selection transistors TR3 and TR4 are respectively arranged at both sides of the wires 16. In this regard, the third selection transistor TR3 is disposed adjacent to the first wire 161, and the fourth selection transistor TR4 is disposed adjacent to the Nth wire 164.

The third selection transistor TR3 includes a third gate electrode 142 formed on a third active region 141, and source/drain impurity regions (not shown) formed on both sides of the third gate electrode 142 on the third active region 141. The fourth selection transistor TR4 includes a fourth gate electrode 152 formed on a fourth active region 151, and source/drain impurity regions (not shown) formed on both sides of the fourth gate electrode 152 on the fourth active region 151. The first and third selection transistors TR1 and TR3 are arranged adjacent to the first wire 161 from among the wires 16. In addition, the second and fourth selection transistors TR2 and TR4 are arranged adjacent to the Nth wire 164 from among the wires 16.

Figure 3:
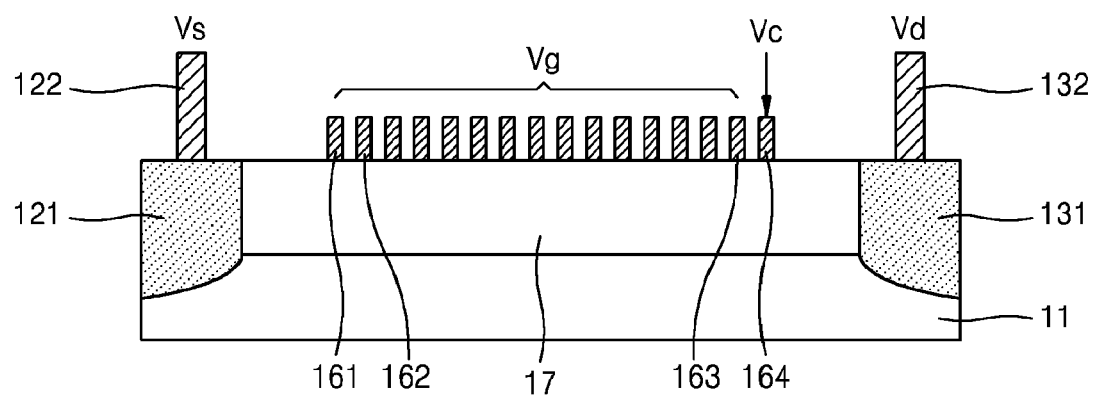
FIG. 3 is a cross-sectional view of the semiconductor device of FIG. 1 taken along a line 3-3 of FIG. 2.

FIG. 3 is a cross-sectional view of the semiconductor device 10 taken along a line 3-3 of FIG. 2, according to an embodiment. Referring to FIG. 3, the semiconductor device 10 includes the first and second active regions 121 and 131 and a field region 17 which are formed on the substrate 11. The first selection transistor TR1 including the first gate electrode 122 is formed on the first active region 121. The second selection transistor TR2 including the second gate electrode 132 is formed on the second active region 131. N wires are formed on the field region 17. In addition, the N wires may be respectively connected to N word lines WL0, WL1, through WLn-1 and WLn of FIG. 1. In FIG. 3, sixteen wires 161, 162 through 163 and 164 are arranged on the field region 17, but the inventive concept is not limited thereto. In this regard, N may be 16 or more. Also, in FIG. 3, sixteen wires are shown but only four reference numerals 161, 162, 163 and 164 are shown for convenience.

For example, since a programming voltage is applied to a memory cell which is subject to a programming operation from among a plurality of memory cells during the programming operation of a semiconductor device, the programming voltage is applied to a wire connected to a gate electrode of the memory cell which is subject to the programming operation. In this case, the programming voltage is generally a high voltage, for example, 25 V.

When a high programming voltage is applied to a wire, a parasitic field effect transistor (FET) may be formed by the wires 161, 162 through 163 and 164 formed on the field region 17, the first active region 121 adjacent to the first wire 161, and the second active region 131 adjacent to the Nth wire 164. That is, on the field region 17, the wires 161, 162 through 163 and 164 may function as a gate of the parasitic FET, the first active region 121 may function as a source of the parasitic FET, and the second active region 131 may function as a drain of the parasitic FET. Thus, a channel may be formed between the first and second active regions 121 and 131 on the substrate 11 below the field region 17. Thus, leakage current may flow from the second active region 131 to the first active region 121 through the channel. Hereinafter, the first active region 121 will be referred to as a source region of the parasitic FET, the second active region 131 will be referred to as a drain region of the parasitic FET, and the wires 161, 162 through 163 and 164 will be referred to as a gate region of the parasitic FET.

According to this embodiment of the inventive concept, as illustrated in FIG. 3, when a source voltage Vs is applied to the source region, a drain voltage Vd is applied to the drain region, and a gate voltage Vg is applied to the gate region, a control voltage Vc lower than the gate voltage Vg is applied to the Nth wire 164 adjacent to the drain region from among the N wires of the gate region. For example, when the source voltage Vs is 0 V, the drain voltage Vd is 25 V, and the gate voltage Vg is 25V, the control voltage Vc may be 0 V.

In order to program all N memory cells, a programming voltage, that is, the gate voltage Vg is applied to the N wires connected to the N memory cells. In this case, leakage current flowing along a channel between the source region and the drain region, that is, between the first and second active regions 121 and 131 is about 1 nA. However, when the control voltage Vc of 0 V is applied to the Nth wire 164 adjacent to the drain region and the gate voltage Vg is applied to the first through (N−1)th wires 161 through 163, leakage current flowing along a channel between the first and second active regions 121 and 131 is about 1 pA. In this case, leakage current may decrease to 1/1000 of that when the gate voltage Vg is applied to all N wires. Thus, leakage current due to the increase of the integration density of a semiconductor device may be prevented.

According to this embodiment of the inventive concept, the control voltage Vc which is lower than the gate voltage Vg is applied to the Nth wire 164 adjacent to the drain region, and thus formation of a channel of the parasitic FET may be prevented. In this regard, the control voltage Vc may be the lowest voltage from among voltages applied to the first through Nth wires 161, 162, through 163 and 164, and may be, for example, 20 V or less.

According to another embodiment of the inventive concept, the control voltage Vc which is lower than the gate voltage Vg may be applied to the (N−1)th wire 163 that is adjacent to the Nth wire 164 adjacent to the drain region. In this regard, the control voltage Vc applied to the (N−1)th wire 163 may be the lowest voltage from among voltages applied to the first through Nth wires 161, 162, through 163 and 164, except for the control voltage Vc applied to the Nth wire 164. However, the inventive concept is not limited thereto. That is, the channel formation may be prevented by applying the control voltage Vc to any wire adjacent to the drain region.

According to another embodiment of the inventive concept, a wire connected to the ground select line GSL, the source select line SSL or the dummy line may be disposed adjacent to the drain region on the field region 17. Since a voltage lower than a program voltage is applied to the ground select line GSL, the source select line SSL or the dummy line, formation of a channel of the parasitic FET may be prevented without controlling the control voltage Vc.

Figure 4:
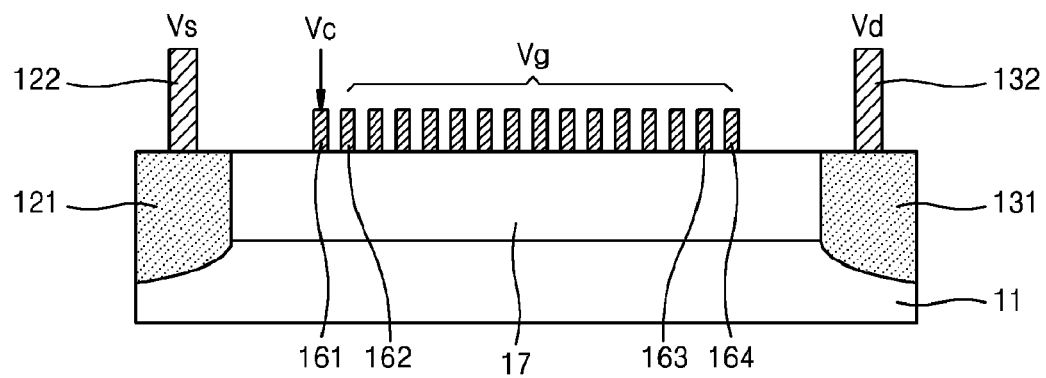
FIG. 4 is a cross-sectional view of the semiconductor device of FIG. 1 taken along the line 3-3 of FIG. 2, according to another embodiment of the inventive concept.

FIG. 4 is a cross-sectional view of the semiconductor device 10 taken along the line 3-3 of FIG. 2, according to another embodiment of the inventive concept. When FIG. 3 and FIG. 4 are compared, the semiconductor device 10 of FIG. 3 is the same as the semiconductor device 10 of FIG. 4 except for a location of a wire to which the control voltage Vc is applied. Thus, the semiconductor device 10 of FIG. 4 will now be described in terms of differences between the semiconductor device 10 of FIG. 3 and the semiconductor device 10 of FIG. 4.

Referring to FIG. 4, when the source voltage Vs is applied to the source region, the drain voltage Vd is applied to the drain region, and the gate voltage Vg is applied to the gate region, the control voltage Vc which is lower than the gate voltage Vg is applied to the first wire 161 adjacent to the source region from among the first through Nth wires 161, 162 through 163 and 164. For example, when the source voltage Vs is 0 V, the drain voltage Vd is 25 V, and the gate voltage Vg is 25 V, the control voltage Vc may be 0 V.

As described above, in order to program all N memory cells, a programming voltage, that is, the gate voltage Vg is applied to the N wires connected to the N memory cells. In this case, leakage current flowing along a channel between the source region and the drain region, that is, between the first and second active regions 121 and 131 is about 1 nA. However, when the control voltage Vc is applied to the first wire 161 adjacent to the source region, leakage current flowing along the channel between the first and second active regions 121 and 131 is about 1 pA. In this case, leakage current may decrease to 1/1000 of that when the gate voltage Vg is applied to all N wires.

According to the present embodiment, the control voltage Vc which is lower than the gate voltage Vg is applied to the first wire 161 adjacent to the source region, and thus formation of a channel of the parasitic FET may be prevented. At this time, the control voltage Vc may be the lowest voltage from among voltages applied to the first through Nth wires 161, 162, through 163 and 164, and may be, for example, 20 V or less.

According to another embodiment of the inventive concept, the control voltage Vc which is lower than the gate voltage Vg may be applied to the second wire 162 that is adjacent to the first wire 161 adjacent to the source region. In this regard, the control voltage Vc applied to the second wire 162 may be the lowest voltage from among voltages applied to the first through Nth wires 161, 162, through 163 and 164, except for the control voltage Vc applied to the first wire 161. However, the inventive concept is not limited thereto. That is, the channel formation may be prevented by applying the control voltage Vc to any wire adjacent to the source region.

According to another embodiment of the inventive concept, a wire connected to the ground select line GSL, the source select line SSL or the dummy line may be disposed adjacent to the source region on the field region 17. Since a voltage lower than a program voltage is applied to the ground select line GSL, the source select line SSL or the dummy line, formation of a channel of the parasitic FET may be prevented without controlling the control voltage Vc.

Figure 5:
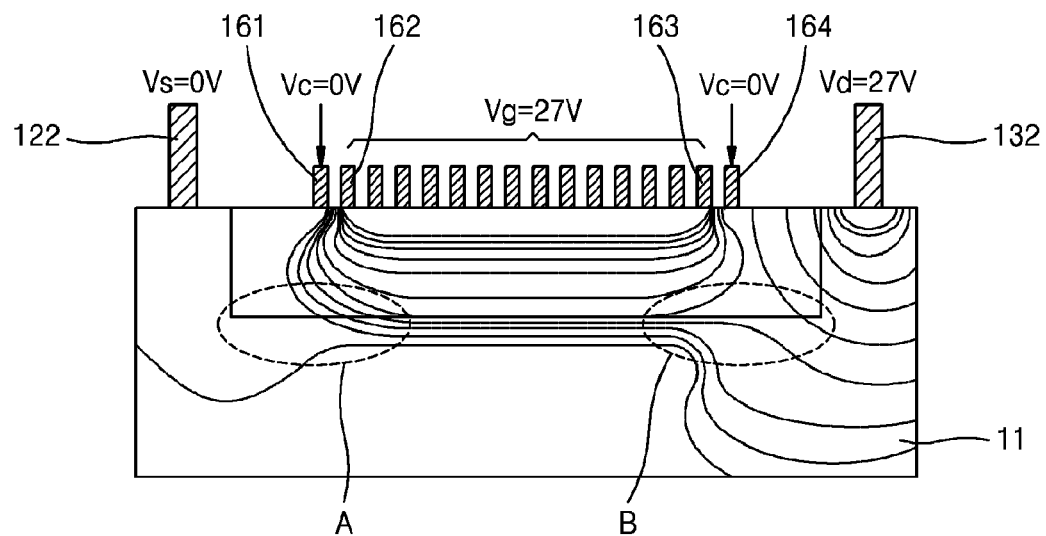
FIG. 5 is a cross-sectional view for describing an electrostatic potential during a programming operation of the semiconductor device of FIG. 2.

FIG. 5 is a cross-sectional view for describing electrostatic potential during a programming operation of the semiconductor device 10 of FIG. 2. Referring to FIG. 5, when the source voltage Vs of 0 V is applied to the source region, the drain voltage Vd of 27 V is applied to the drain region, the control voltage Vc of 0 V is applied to both the first wire 161 adjacent to the source region and the Nth wire 164 adjacent to the drain region, and the gate voltage Vg of 27 V, that is, a programming voltage is applied to the second wire 162 through the (N−1)th wire 163, the electrostatic potential of the semiconductor device 10 is illustrated.

In FIG. 5, a voltage around the source region, that is the first wire 161, and the Nth wire 164, to which 0 V is applied, is 0 V. However, a voltage around the second wire 162 through the (N−1)th wire 163 and the drain region, to which 27 V is applied, increases. The closer to the second wire 162 through the (N−1)th wire 163 and the drain region to which 27 V is applied, the higher the electrostatic potential of the semiconductor device 10.

Comparing the cases where the control voltage Vc is applied to the first wire 161 and the Nth wire 164, a high voltage is applied to only one side of the first wire 161, but a high voltage is applied to both sides of the Nth wire 164. Comparing a substrate region A below the first wire 161 and a substrate region B below the Nth wire 164, it is difficult to form a channel since a voltage induced around the channel by the first wire 161 in the substrate region A below the first wire 161 is relatively low, but it is relatively easy to form a channel since a voltage induced around the channel by the Nth wire 164 in the substrate region B below the Nth wire 164 is relatively high. Thus, when the control voltage Vc is applied to the first wire 161, the increase in voltage applied to a substrate may be effectively prevented, and thus channel formation may be prevented.

Figure 6:
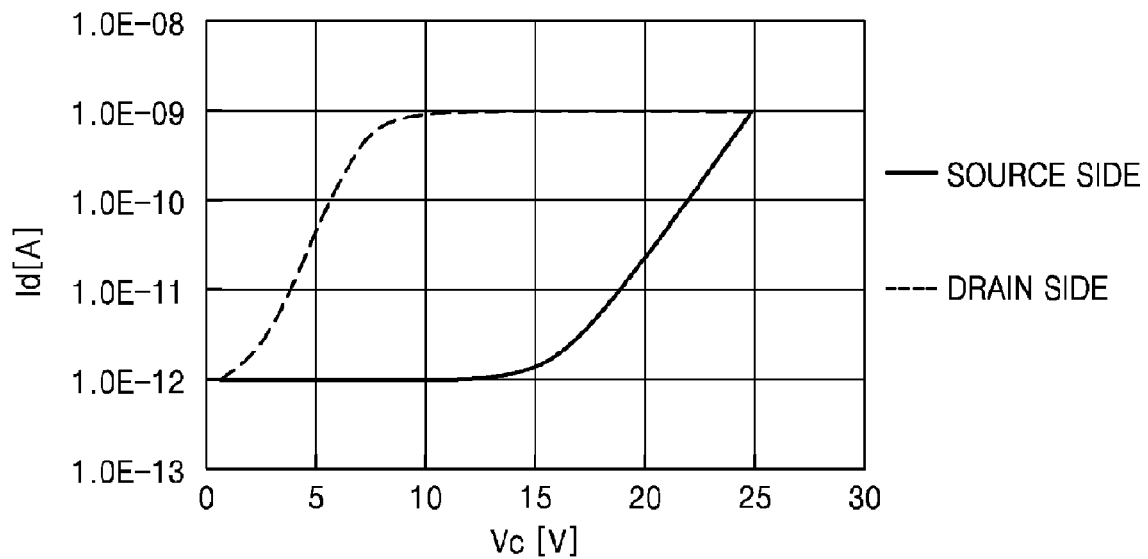
FIG. 6 is a graph showing leakage current of the semiconductor devices of FIGS. 3 and 4.

FIG. 6 is a graph showing leakage current of the semiconductor device 10 of FIGS. 3 and 4. Referring to FIG. 6, the horizontal axis indicates the control voltage Vc, and the vertical axis indicates a drain current Id, that is, leakage current between the drain region and the source region. A dotted line indicates the case where the control voltage Vc is applied to the Nth wire 164 adjacent to the drain region, as illustrated in FIG. 3. A solid line indicates the case where the control voltage Vc is applied to the first wire 161 adjacent to the source region, as illustrated in FIG. 4.

When the control voltage Vc is applied to the first wire 161 adjacent to the source region, the drain current Id is maintained at about 1 pA until the control voltage Vc reaches about 15 V. When the control voltage Vc is equal to or greater than 15 V, the drain current Id increases remarkably. When the control voltage Vc is 25 V that is the same as a programming voltage, the drain current Id is 1 nA. When the control voltage Vc is applied to the Nth wire 164 adjacent to the drain region, the drain current Id is about 1 pA if the control voltage Vc is about 0 V, the drain current Id increases remarkably if the control voltage Vc is greater than 0 V, and then the drain current Id is maintained at about 1 nA if the control voltage Vc is equal to or greater than about 10 V.

Referring to FIGS. 5 and 6, since the increase in voltage applied to a substrate may be greatly prevented when the control voltage Vc is 0 V, the drain current Id may be remarkably reduced by applying the control voltage Vc to any one of the first wire 161 and the Nth wire 164. In the case where the control voltage Vc is 5 V, since a high voltage is applied to only one side of the first wire 161 when the control voltage Vc is applied to the first wire 161, it is difficult to form a channel, and thus the drain current Id may be greatly reduced. However, since a high voltage is applied to both sides of the Nth wire 164 when the control voltage Vc is applied to the Nth wire 164, the voltage applied to a substrate increases, and thus a channel is formed so that the drain current Id increases.

As a result, when the control voltage Vc is applied to the first wire 161 adjacent to the source region, greater margin of the control voltage Vc may be obtained, and thus leakage current may be more effectively reduced compared to the case when the control voltage Vc is applied to the Nth wire 164 adjacent to the drain region.

Figure 7:
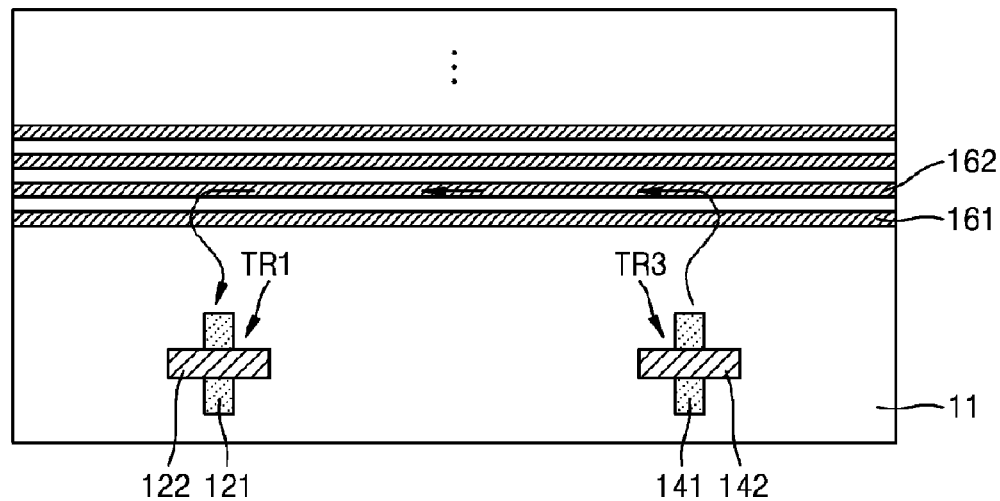
FIG. 7 is a plan view of a portion of the semiconductor device of FIG. 2, according to another embodiment of the inventive concept.

FIG. 7 is a plan view of a portion of the semiconductor device 10 of FIG. 2. Referring to FIG. 7, the semiconductor device 10 includes the first and third active regions 121 and 141 and a field region, which are formed on the substrate 11. The first selection transistor TR1 including the first gate electrode 122 is formed on the first active region 121, and the third selection transistor TR3 including the third gate electrode 142 is formed on the third active region 141. A plurality of wires 161, 162 are arranged on the field region. In FIG. 7, only some of the wires 161, 162 are illustrated. In addition, the semiconductor device 10 of FIG. 7 may be used as an example during the programming operation of a semiconductor device, like in FIGS. 3 and 4. In this regard, the wires 161, 162 may be connected to a plurality of word lines.

When a high voltage (e.g., 25 V) is applied to the wires 161, 162 on the field region, a high voltage (e.g., 25 V) is applied to the third selection transistor TR3, and a lower voltage (e.g., 0 V) than the voltage applied to the third selection transistor TR3 is applied to the first selection transistor TR1, a parasitic FET may be formed by the wires 161, 162, the first active region 121, and the third active region 141. That is, the wires 161, 162 function as a gate of the parasitic FET, the first active region 121 functions as a source of the parasitic FET, and the third active region 141 functions as a drain of the parasitic FET. Thus, a channel may be formed between the first and third active regions 121 and 141 on the substrate 11 below the field region. Thus, leakage current may flow along the channel from the third active region 141 to the first active region 121.

According to the present embodiment, the first wire 161 adjacent to the first and third active regions 121 and 141 is set as a control wire from among the wires 161, 162, the control voltage Vc applied to the control wire may be controlled to be lower than a voltage applied to a surrounding wire. Thus, a channel of a parasitic FET may be prevented from being formed below the field region. In this regard, the control voltage Vc may be the lowest from among voltages applied to the wires 161, 162, and may be, for example, 20 V or less.

According to another embodiment of the inventive concept, the second wire 162 that is adjacent to the first wire 161 adjacent to the first and third active regions 121 and 141 may be set as a control wire from among the wires 161, 162, the control voltage Vc applied to the control wire may be controlled to be lower than a voltage applied to a surrounding wire. In this regard, the control voltage Vc applied to the second wire 162 may be the lowest from among voltages applied to the wires 161, 162 except for the control voltage Vc applied to the first wire 161. However, the inventive concept is not limited thereto. That is, formation of a channel of the parasitic FET may be prevented by applying the control voltage Vc to any wire adjacent to the first and third active regions 121 and 141.

According to another embodiment of the inventive concept, the ground select line GSL, the source select line SSL or a dummy wire may be arranged adjacent to the first and third active regions 121 and 141 on the field region. Since a voltage lower than a program voltage is applied to a ground selection line, a source selection line, or the dummy wire, formation of a channel of the parasitic FET may be prevented without controlling the control voltage Vc.

Figure 8:
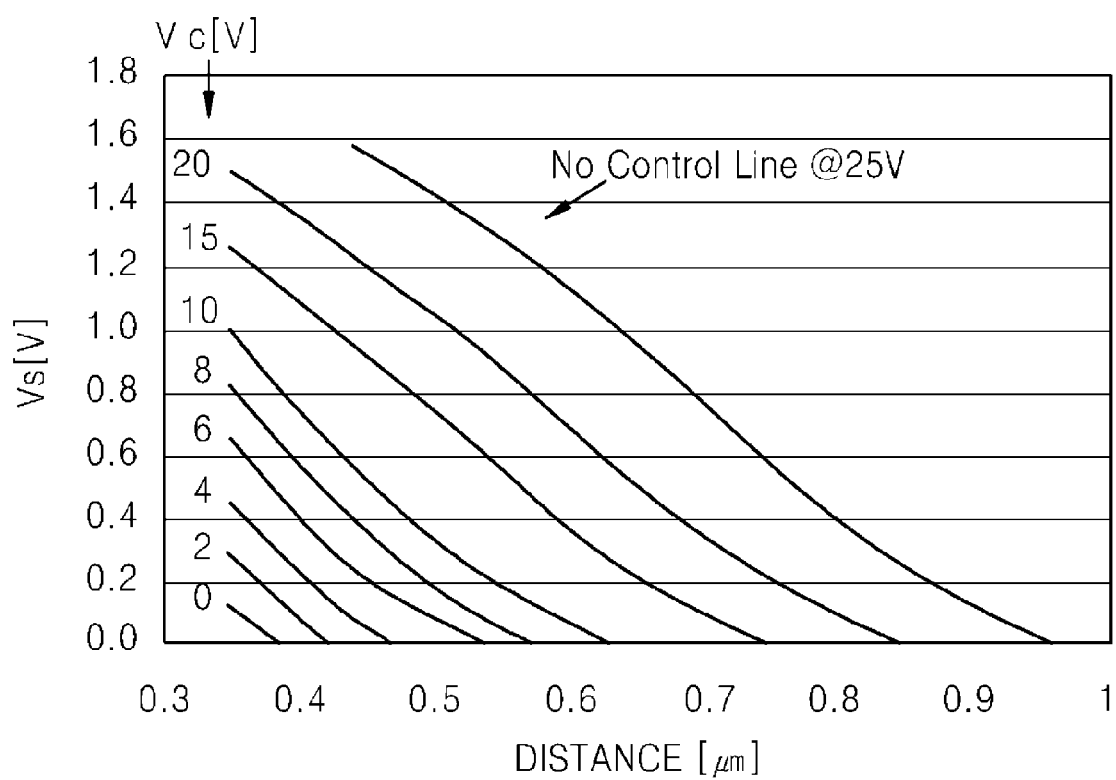
FIG. 8 is a graph showing a relationship between a control voltage and a length of a wire and an active region when leakage current of the semiconductor device of FIG. 7 is 10 nA.

FIG. 8 is a graph showing a relationship between a control voltage and a distance between a wire and an active region when leakage current of the semiconductor device 10 of FIG. 7 is 10 nA. Referring to FIG. 8, the horizontal axis indicates distance between the wire and the active region (that is, the first and third selection transistors TR1 and TR3), and the vertical axis indicates a voltage Vs applied to the first selection transistor TR1 that is a source region. Compared to the case where leakage current between the first active region 121 that is a source region and the third active region 141 that is a drain region is 10 nA, the distance between the wire and the first and third selection transistors TR1 and TR3 according to a change in the control voltage Vc may be known.

Hereinafter, when the source voltage Vs is 0 V, and the leakage current is 10 nA, a relationship between the control voltage Vc and the distance between the wire and the active regions will be described.

When the control voltage Vc applied to a control wire is 25 V, that is, when a control wire is not separately set, the distance between the wire and the active region is about 1 um. However, the lower the control voltage Vc applied to the control wire, the smaller the distance between the wire and the active regions when a leakage current is 10 nA. Specifically, when the control voltage Vc applied to the control wire is 0 V, the distance between the wire and the active regions when a leakage current is 10 nA, is 0.4 um or less. By reducing the control voltage Vc applied to the control wire, the distance between the wire and the active regions may be remarkably reduced, and thus the integration density of the semiconductor device 10 may be remarkably increased.

Figure 9:
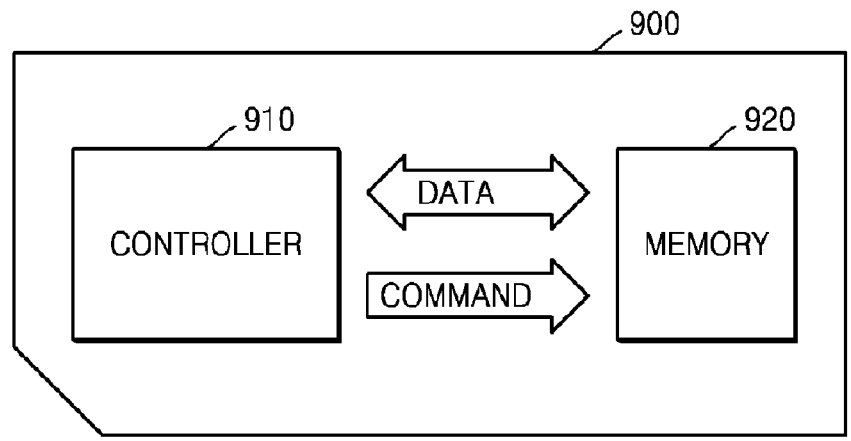
FIG. 9 is a schematic view of a card, according to an embodiment of the inventive concept.

FIG. 9 is a schematic view of a card 900, according to an embodiment of the inventive concept. Referring to FIG. 9, the card 900 may be arranged so that a controller 910 and a memory 920 exchange an electrical signal. For example, when the controller 910 issues a command, the memory 920 may transmit data. The memory 920 may include the semiconductor device 10 of FIG. 2. The card 900 may be used in a memory device such as a memory stick card, a smart media card (SM), a secure digital (SD), a mini secure digital card (SD), or a multi media card (MMC).

Figure 10:
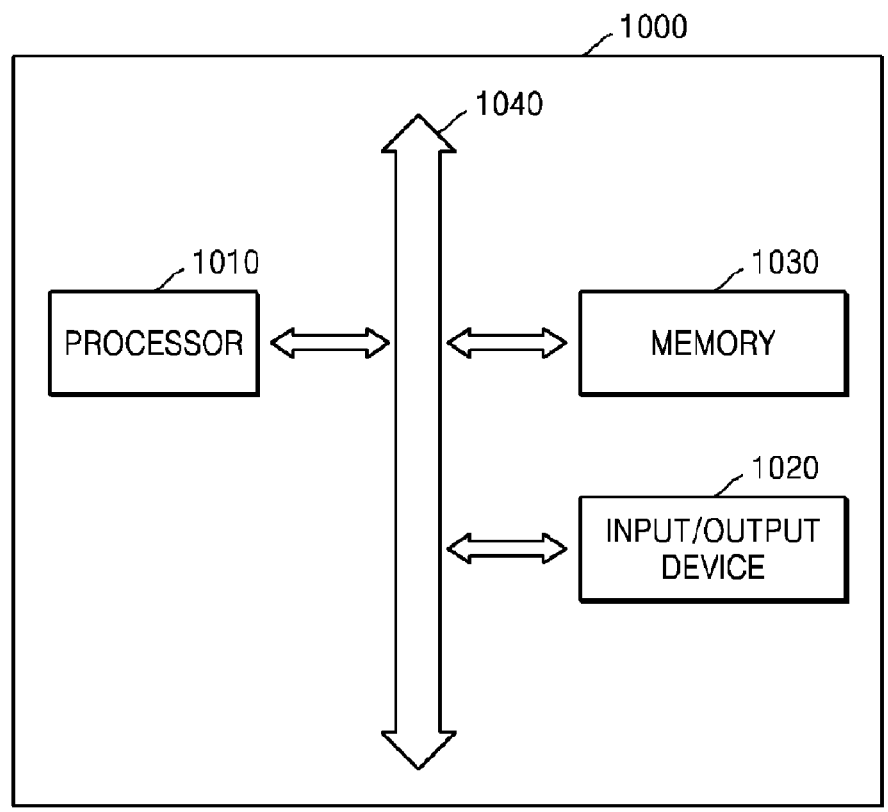
FIG. 10 is a schematic view of a system, according to an embodiment of the inventive concept.

FIG. 10 is a schematic view of a system 1000, according to an embodiment of the inventive concept. Referring to FIG. 10, the system 1000 includes a processor 1010, an input/output device 1020, a memory 1030 and a bus 1040. The processor 1010, input/output device 1020 and memory 1030 may perform data communication by using the bus 1040. The processor 1010 may execute programs, and may control the system 1000. The input/output device 1020 may be used to input or output data of the system 1000. The system 1000 is connected to an external apparatus, for example, a personal computer or a network by using the input/output device 1020 so as to exchange data with the external apparatus. The memory 1030 may include the semiconductor device 10 of FIG. 2. For example, the memory 1030 may store code and data for an operation of the processor 1010. The system 1000 may be used in mobile phones, MP3 players, navigation systems, portable multimedia players (PMPs), solid state disks (SSDs), or household appliances.

While the inventive concept has been particularly shown and described with reference to exemplary embodiments thereof, it will be understood that various changes in form and details may be made therein without departing from the spirit and scope of the following claims.

What is claimed is:

1. A method of applying a wire voltage to a semiconductor device including a plurality of active regions and a field region insulating the plurality of active regions, the field region including a plurality of wires, the method comprising:
applying an operating voltage required for an operation of the semiconductor device to at least one of the plurality of wires; and
applying a voltage lower than the operating voltage to a wire from among the plurality of wires that is adjacent to at least one of the plurality of active regions,
wherein the plurality of wires are respectively connected to a plurality of word lines, and the operating voltage comprises a programming voltage,
wherein the semiconductor device comprises a plurality of selection transistors respectively formed on the plurality of active regions,
wherein the semiconductor device further comprises at least one of a ground select line (GSL), a source select line (SSL) and a dummy wire disposed adjacent to one of the active regions on the field region, and
wherein a voltage applied to the ground select line (GSL), the source select line (SSL) and the dummy wire is equal to or less than 20 V.

2. The method of claim 1, wherein the active regions includes first and second active regions which are respectively disposed on opposite sides of an entire set of the plurality of wires, and wherein a parasitic field effect transistor is formed by the first and second active regions and the plurality of wires, the method further comprising:
applying a lowest voltage from among voltages applied to the plurality of wires to a wire from among the plurality of wires that is most adjacent to at least one of the first and second active regions.

3. The method of claim 2, further comprising:
applying a second lowest voltage from among the voltages applied to the plurality of wires to a second wire from among the plurality of wires that is adjacent to the wire that is most adjacent to at least one of the first and second active regions.

4. The method of claim 1, wherein the active regions comprise first and third active regions which are both disposed adjacent to an outermost wire from among the plurality of wires, and wherein a parasitic field effect transistor is formed by the first and third active regions and the plurality of wires, the method further comprising:
applying a lowest voltage from among voltages applied to the plurality of wires to a wire from among the plurality of wires that is most adjacent to the first and third active regions.

5. The method of claim 4, further comprising:
applying a second lowest voltage from among the voltages applied to the plurality of wires to a second wire that is adjacent to the outermost wire.

6. The method of claim 2, wherein the lowest voltage from among the voltages applied to the plurality of wires is equal to or less than 20 V.

7. The method of claim 4, wherein the lowest voltage from among the voltages applied to the plurality of wires is equal to or less than 20 V.

* * * * *